United States Patent
Yang et al.

(10) Patent No.: US 6,518,671 B1
(45) Date of Patent: *Feb. 11, 2003

(54) BIT LINE LANDING PAD AND BORDERLESS CONTACT ON BIT LINE STUD WITH LOCALIZED ETCH STOP LAYER AND MANUFACTURING METHOD THEREOF

(75) Inventors: Won-Suk Yang, Yongin (KR);
Yoo-Sang Hwang, Suwon (KR);
Hong-Sik Jeong, Suwon (KR);
Ki-Nam Kim, Anyang (KR)

(73) Assignee: Samsung Electronics Co. Ltd. (KR)

( * ) Notice: Subject to any disclaimer, the term of this patent is extended or adjusted under 35 U.S.C. 154(b) by 129 days.

This patent is subject to a terminal disclaimer.

(21) Appl. No.: 09/699,591

(22) Filed: Oct. 30, 2000

(51) Int. Cl.[7] .............................................. H02L 23/48
(52) U.S. Cl. ..................... 257/758; 257/760; 438/639
(58) Field of Search ............... 257/758, 760; 438/639

(56) References Cited

U.S. PATENT DOCUMENTS

| | | | |
|---|---|---|---|
| 4,966,870 A | 10/1990 | Barber et al. | 437/228 |
| 5,466,636 A | 11/1995 | Cronin et al. | 437/187 |
| 5,612,254 A | 3/1997 | Mu et al. | 437/195 |
| 5,808,335 A | 9/1998 | Sung | 257/306 |
| 5,891,799 A | 4/1999 | Tsui | 438/624 |
| 5,895,239 A | 4/1999 | Jeng et al. | 438/239 |
| 5,918,120 A | 6/1999 | Huang | 438/239 |
| 6,022,776 A | 2/2000 | Lien et al. | 438/253 |
| 6,074,952 A * | 6/2000 | Liu et al. | 438/706 |
| 6,083,824 A | 7/2000 | Tsai et al. | 438/629 |
| 6,159,839 A * | 12/2000 | Jeng et al. | 438/618 |
| 6,265,271 B1 * | 7/2001 | Thei et al. | 438/296 |
| 6,329,255 B1 * | 12/2001 | Gau | 438/299 |
| 6,339,027 B1 * | 1/2002 | Chok | 438/692 |
| 6,350,649 B1 * | 2/2002 | Jeong et al. | 438/253 |

OTHER PUBLICATIONS

"Impact of passivation film deposition and post–annealing on the reliability of flash memories," Shuto et al., 1997 ICEE International Reliability Physics Symposium Proceedings (35th Annual), pp. 17–24.

* cited by examiner

*Primary Examiner*—Richard Elms
*Assistant Examiner*—Christian D. Wilson
(74) *Attorney, Agent, or Firm*—Mills & Onello, LLP

(57) ABSTRACT

An etch-stop layer is selectively provided between layers of a multiple-layered circuit in a selective manner so as to allow for outgassing of impurities during subsequent fabrication processes. The etch-stop layer is formed over an underlying stud so as to serve as an alignment target during formation of an overlying stud formed in an upper layer. In this manner multiple-layered circuits, for example memory devices, can be fabricated in relatively dense

6 Claims, 9 Drawing Sheets

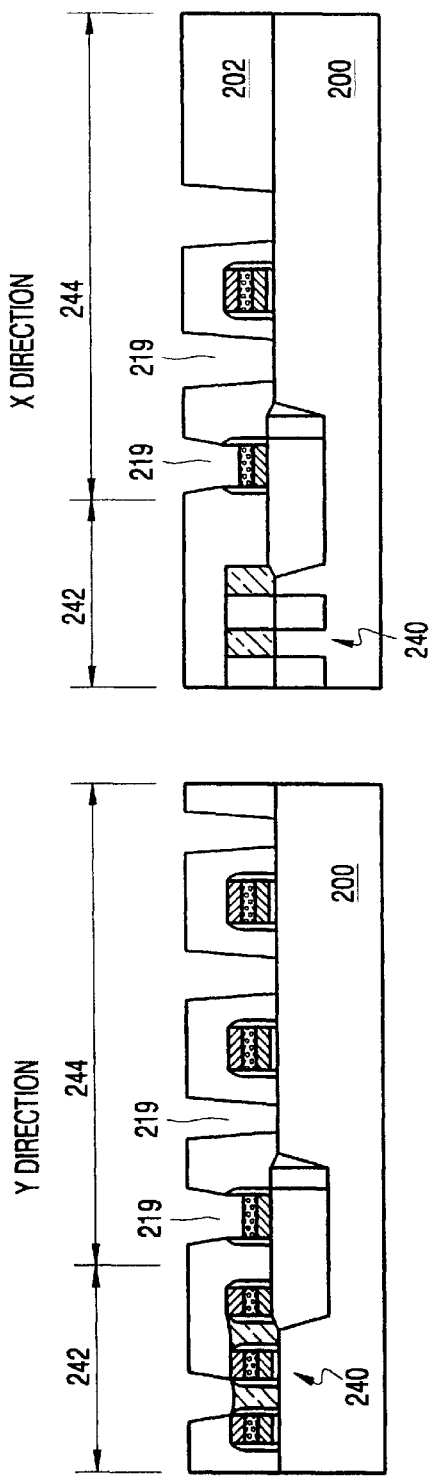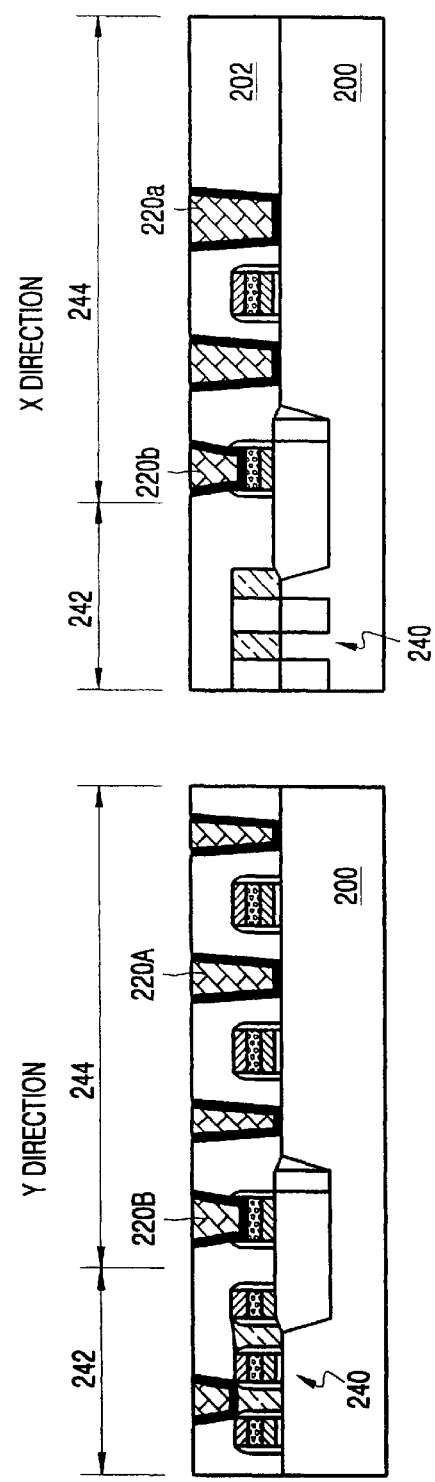

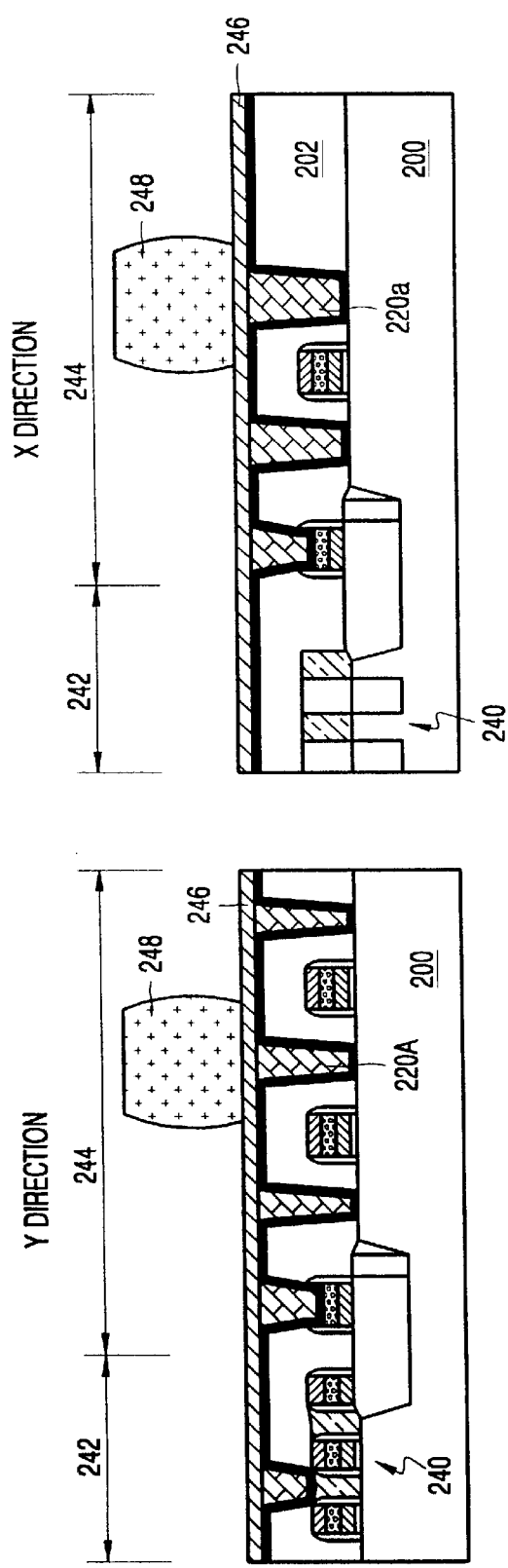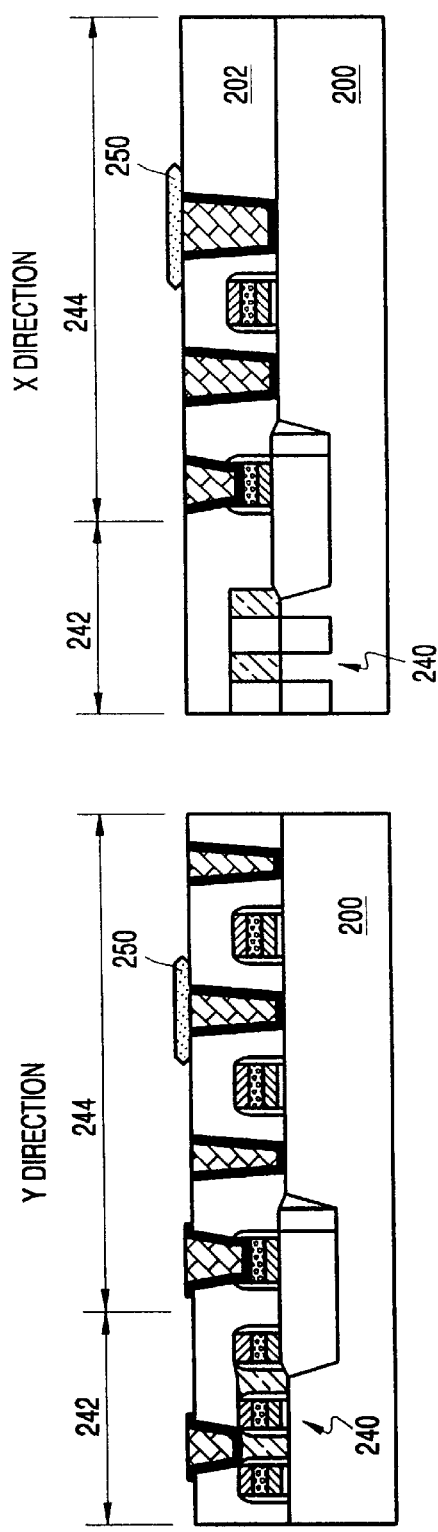
FIG. 3C
FIG. 3D

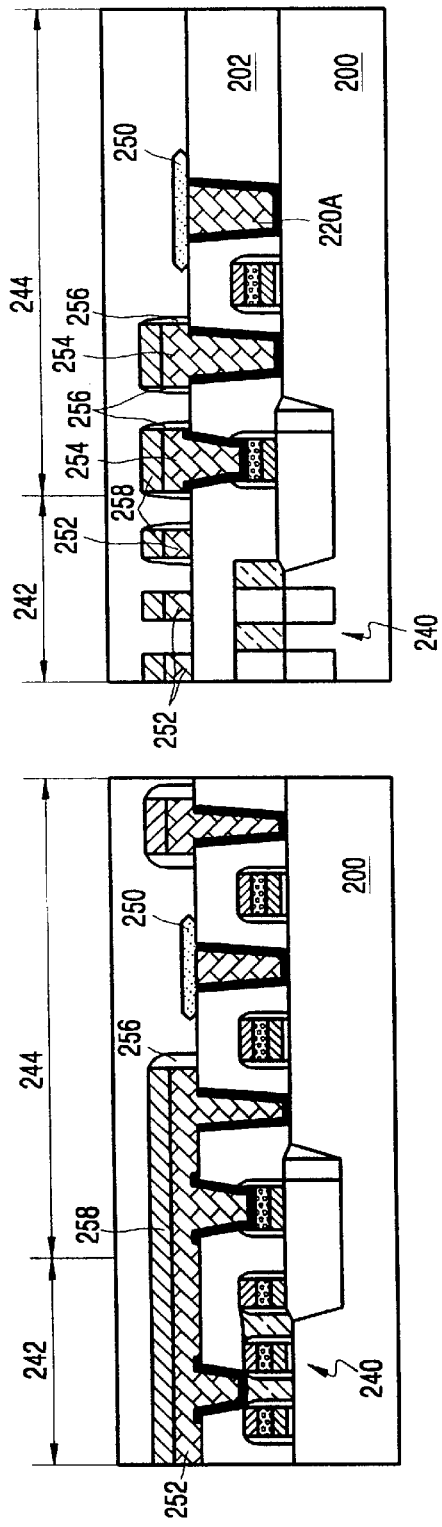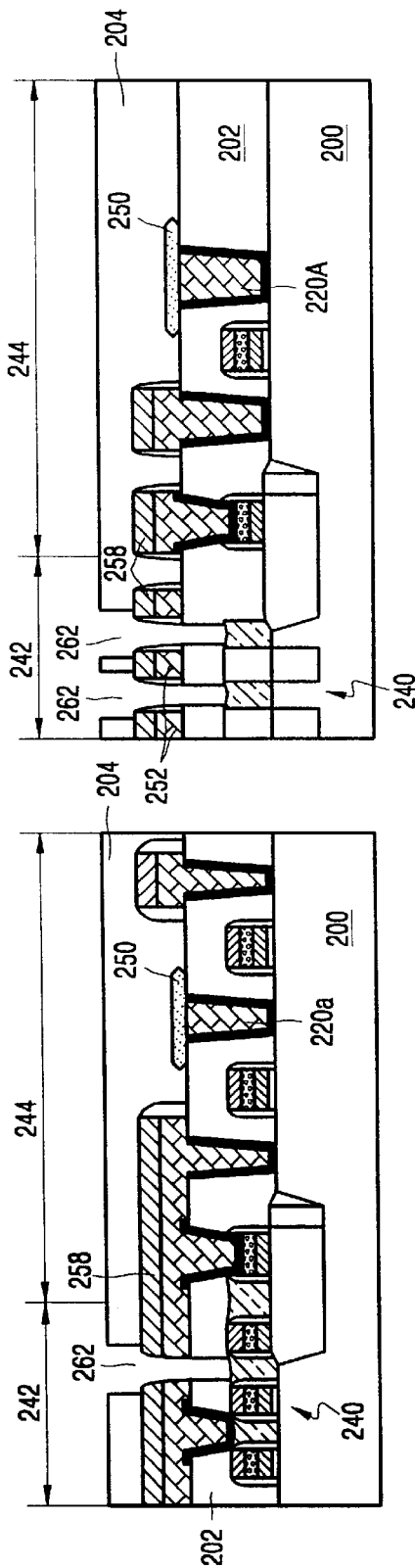

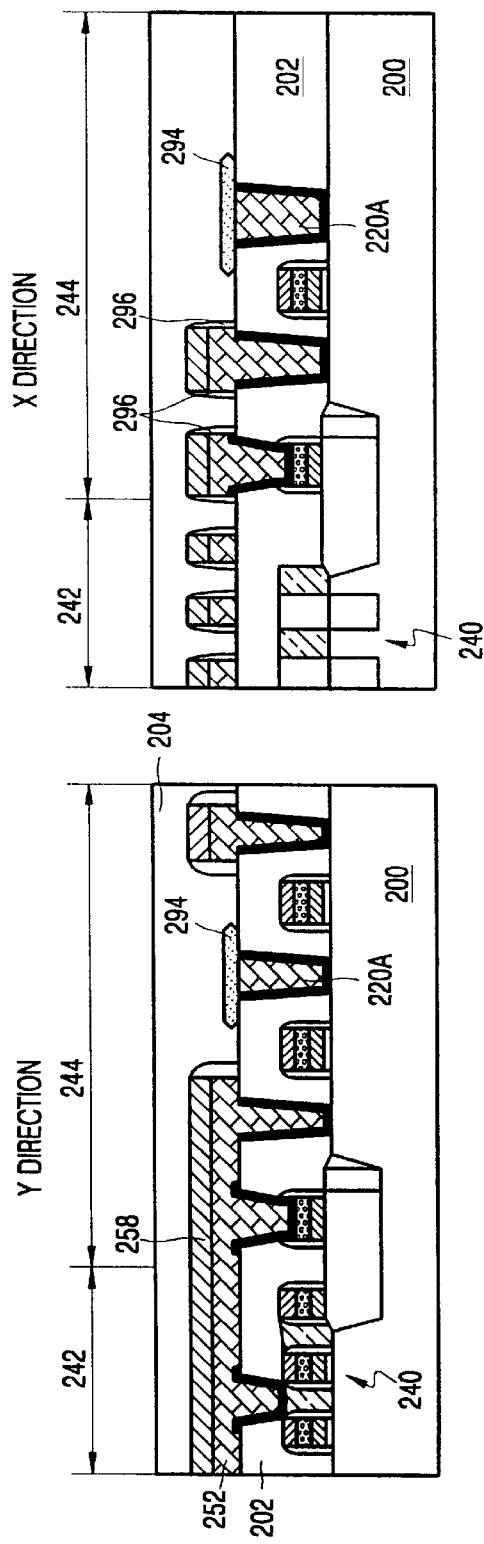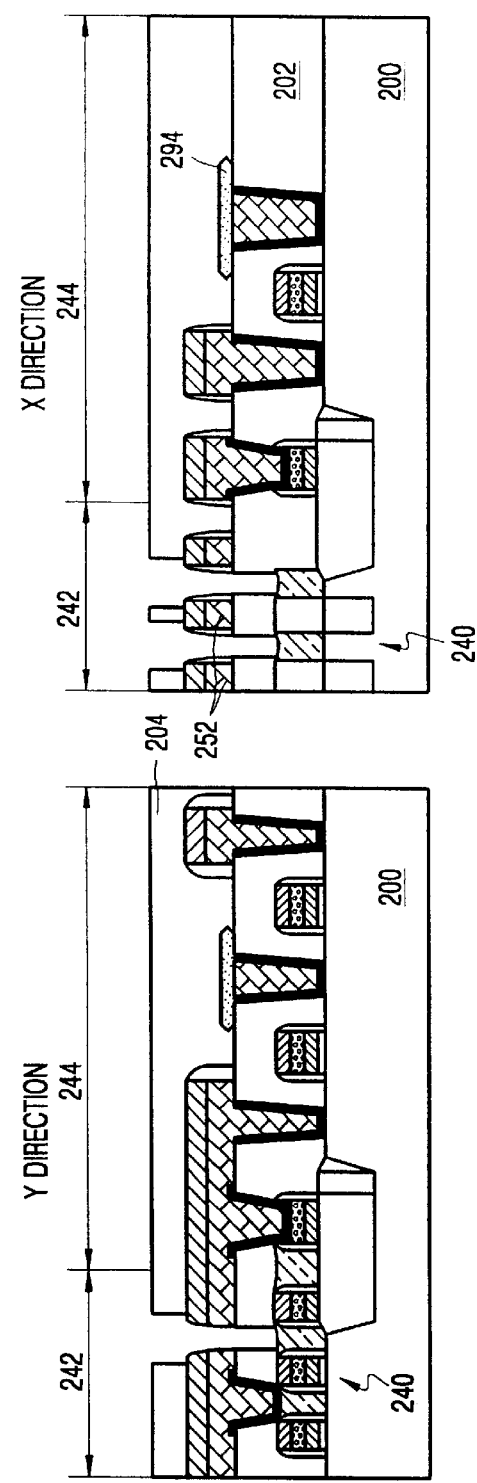

BIT LINE LANDING PAD AND BORDERLESS CONTACT ON BIT LINE STUD WITH LOCALIZED ETCH STOP LAYER AND MANUFACTURING METHOD THEREOF

RELATED APPLICATIONS

The present application is related to U.S. Ser. No. 09/699,849, entitled "Bit Line Landing Pad and Borderless Contact on Bit Line Stud with Etch Stop Layer and Manufacturing Method Thereof, filed of even date herewith; and U.S. Ser. No. 09/699,589, entitled "Bit Line Landing Pad and Borderless Contact on Bit Line Stud with localized Etch Stop Layer Formed in Void Region, and Manufacturing Method Thereof", filed of even date herewith, and incorporated herein by reference.

BACKGROUND OF THE INVENTION

In order to make more efficient use of integrated circuit surface area, conventional two-dimensional semiconductor technology has evolved such that contemporary circuits are formed on multiple layers in a three-dimensional configuration. In such configurations, active devices and interconnects are formed in a layered relationship. During the formation of each subsequent layer, an inter-layer pathway, referred to in the art as a "plug", or "stud" is electrically coupled between the various active devices and transmission lines of the different layers. To assist in aligning a plug, "landing pads" or "taps" are formed in lower layers to serve as a target for the plugs passing from the upper layer. The landing pads are coupled to an underlying circuit or interconnect and are generally larger in surface area than the circuit or interconnect to serve as a wider-tolerance target for the plug.

Such multi-layered technology has enabled the design of highly-integrated memory devices, for example DRAM devices, having extremely high capacity, for example above 1 gigabyte. Such DRAM devices include multiple arrays of memory cells, densely and efficiently laid out under tight design constraints. Between the cell areas are peripheral regions, which include supporting circuitry and interconnect circuitry between the cells, as well as input/peripherals, and the like.

Any misalignment between the vertical plugs and the horizontal interconnect features can cause defects and reliability problems. To ensure that the plug aligns with a feature, the features are made larger than required, for example through the use of landing pads. The area by which the feature is made larger is referred to in the art as a "border" around the vertical contact hole. Any excessive border area thus has a negative impact on circuit density.

Attempts have been made in the past to provide multiple layer interconnect, while reducing or eliminating the border area. These include circuits and fabrication procedures disclosed in U.S. Pat. Nos. 6,083,824, 5,612,254, and 4,966,870.

To a larger extent, the packing density of circuits is limited by how closely the interconnect metal between circuits can be formed without encroaching on each other. These limits are dictated by design rules that govern the separation of one level of contact from another, and by design rules for nesting tolerance or for borders used around contacts.

Other efforts have made toward reducing the high-aspect ratio of the holes made for inter-level interconnects, where the aspect ratio refers the height of a hole as compared to its width. In general, the deeper the hole, the more difficult it is to fabricate the hole. Using the line of an underlying circuit, for example a bit line of a DRAM memory device, as a landing pad, the aspect ratio of the interconnection hole can be significantly reduced.

A typical multiple-layer DRAM memory device includes a cell region and a peripheral region. The cell region includes active switching devices, coupled to vertically-oriented capacitors, that serve as data storage devices. A cell bit line serves as an interconnect to transfer data between peripheral circuit regions and the cell region. The peripheral region includes a number of bit lines, that function as local interconnects, or studs, electrically coupling between the various active devices and transmission lines of the different layers. An insulative oxide layer is formed above the bit lines, and an interconnect stud is opened through the oxide layer and connected to the bit line.

When the bit lines are used for local interconnection, for example especially in sense amplifier regions, the layers of circuits can become very dense and crowded. For example, to access the bit line from an upper layer, the region between the bit lines must be accurately etched to form a stud interconnect hole; both in a lateral direction, so as to avoid contact with adjacent bit lines, and in a vertical direction, so as to ensure that the hole is formed at the proper depth. Because the peripheral region, for example a sense amplifier region of a DRAM device, is often times densely populated with various interconnect paths, the cross-sectional area of any vertical stud interconnects should be minimized. Therefore, the above case requires subsequent formation of high-aspect-ratio studs that are difficult to achieve using contemporary fabrication processes.

Contemporary techniques of forming the interconnect stud are subject to several process limitations. These include horizontal misalignment, in a lateral direction, where the stud hole may be laterally misaligned with the underlying bit line during formation of the stud hole. Vertical misalignment can also occur, wherein the stud hole is not etched deep enough, so the stud does not make contact with the underlying bit line, or wherein the stud hole is etched too deeply, and is etched through the bit line.

To improve alignment accuracy, U.S. Pat. No. 5,895,239 discloses a technique for employing a bit line landing pad together with a bit line stud. However, this approach requires tight tolerances at either, or both, the top portions of the bit lines, including the landing pad, and bottom portions of the upper interconnect stud, so as to provide a minimal width at the top of the bit line, and a maximum width at the bottom of the upper interconnect stud. A wide stud top limits circuit density considerations, while a narrow stud bottom leads to increased contact resistance and an increased aspect ratio that is difficult to accurately fabricate. No provision is made for vertical alignment of the stud, so if the stud hole is slightly misaligned with the underlying bit line, a void can be formed in the underlying inter-layer dielectric adjacent the stud.

Another approach at multiple-layered interconnect is disclosed in U.S. Pat. No. 5,891,799. With reference to FIG. 1, in this approach, an etch-stop layer 206, for example a silicon nitride masking layer ($Si_3N_4$) is formed over an inter-layer dielectric ($SiO_2$) 202, in turn formed over a metal layer 210 formed on a substrate 200. Stud holes 213A, 213B are patterned through the mask layer 206 and underlying dielectric layer 202 for the deposit of studs 212A, 212B to connect between the upper and lower layers. Once the studs 212A, 212B are formed, the masking layer 206 later serves as an etching reference for studs 214A, 214B formed through an upper masking layer 208 and upper dielectric layer 204. However, this technique suffers from a number of limitations. Since the $Si_3N_4$ masking layer 206, 208 is a high-stress-bearing material, and is formed indiscriminately as a layer over the entire circuit, this configuration imparts undue stress on the various layers, which may lead to warping of the circuit. Additionally, due to its high density, the masking layer prevents outgassing of impurities contained in the inter-layer dielectric, for example C, F, and Cl, during later high-temperature processes. The remaining $Si_3N_4$ masking layer would prevent the introduction of $H_2$ and $O_2$ during popular alloy processes, greatly affecting the conductive adhesiveness between the upper and lower metals.

Furthermore, this process is incompatible with contemporary memory fabrication processes, because the $Si_3N_4$ masking layer would be applied between bit lines. Dielectric spacers formed on each lateral side of a cell bit line prevent shorting between the cell bit line and the nearby capacitor. In order to make such spacers, it would be necessary to remove any masking layer between adjacent bit lines to allow for space for the capacitors to be inserted between the bit lines. However, this process would also remove any dielectric layer formed over the bit lines necessary for insulating the bit lines from the capacitors. This would also remove any masking layer on either side of the peripheral region bit lines, defeating the purpose of forming the masking layer in the first place.

SUMMARY OF THE INVENTION

The present invention is directed to a fabrication process and circuit that address the limitations of conventional techniques. For example, the present invention provides an etch-stop layer that is selectively patterned on only a portion of the underlying inter-layer dielectric, thereby allowing for outgassing during later fabrication processes. The remaining etch-stop layer is localized to only those portions surrounding the connecting media, for example surrounding the studs, between lower and upper contact holes. The surface area of the remaining etch-stop layer is preferably large enough so as to provide a suitable alignment target during formation of an overlying stud formed in an upper layer, yet small enough so as not to allow for sufficient outgassing, and so as to not interfere with neighboring contact holes, for example contact holes for nearby bit line landing pads.

In one aspect, the present invention is directed to a semiconductor device comprising first and second circuit regions laterally disposed in a first insulating layer. The first circuit region comprises a conductive line, and the second circuit region comprises a stud. First and second etch stop material layers are formed over the first and second circuit regions, respectively, the first etch stop material layer forming at least one spacer at a sidewall of the conductive line, and the second etch stop material layer being selectively patterned in the second region to cover an area that includes the stud.

The first and second etch stop material layers may comprise the same, or different, etch stop materials, for example $Si_3N_4$, $Ta_2O_5$ and $Al_2O_3$. The second etch stop material layer may extend to cover an area surrounding the stud. The extent of the second etch stop material layer may be limited by the width of the conductive line.

In another aspect, the present invention is directed to a method of forming a semiconductor device. An insulating layer is formed on a substrate. A first circuit region is formed in the insulating layer. At least one conductive line is formed in the first circuit region. A second circuit region is formed in the insulating layer, and at least one stud is formed in the second circuit region. A first etch stop material layer is formed over the first circuit region, the first etch stop material layer forming at least one spacer at a sidewall of the conductive line. A second etch stop material layer is formed over the second circuit region and selectively patterned to cover an area of the second circuit region that includes the stud.

The first and second etch stop material layers may be formed of etch stop materials having first and second etching selectivity characteristics. In this case, the forming and selective patterning of the second etch stop material layer comprises first forming a layer of the second etch stop material over the device, and second, selectively removing the layer of second etch stop material to provide a portion of the second etch stop material over the area containing the stud. The forming of the first etch stop material layer comprises first providing a layer of the first etch stop material over the device, and second selectively removing the first etch stop material such that the spacer is formed on the sidewall of the conductive line.

The first and second etch stop material layers may be formed of the same etch stop material. In this case forming of the first and second etch stop material layers comprises first forming a layer of the etch stop material over the device, and second, selectively removing the layer of the etch stop material to leave a portion of the etch stop material over the area containing the stud and to form the insulative spacer on the sidewall of the conductive line.

BRIEF DESCRIPTION OF THE DRAWINGS

The foregoing and other objects, features and advantages of the invention will be apparent from the more particular description of preferred embodiments of the invention, as 1illustrated in the accompanying drawings in which like reference characters refer to the same parts throughout the different views. The drawings are not necessarily to scale, emphasis instead being placed upon illustrating the principles of the invention.

FIGS. 3A–3G are cutaway side views, the left and right columns being sectioned along orthogonal axes, illustrating use of a selectively patterned etch-stop layer for a multiple-layered memory device including cell and peripheral regions, in accordance with the present invention.

FIGS. 4A–4F are cutaway side views, the left and right columns being sectioned along orthogonal axes, illustrating use of a selectively patterned etch-stop layer for a multiple-layered memory device including cell and peripheral regions, in accordance with an alternative embodiment of the present invention.

DETAILED DESCRIPTION OF PREFERRED EMBODIMENTS

Throughout the detailed description, the principles of the present invention are illustrated in the context of a memory device having cell and peripheral regions. It will be apparent to those skilled in the art that the circuits and processes of the present invention disclosed herein are equally applicable to other multiple-layered circuit embodiments.

Figure 1:
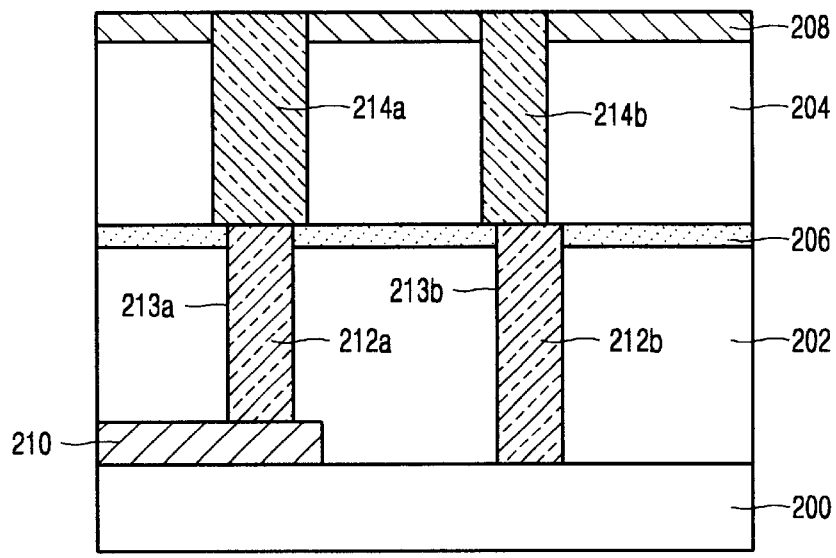
FIG. 1 is a cutaway side view of a conventional multiple-layered interconnect configuration, illustrating the use of a etch-stop layer.
Figure 2:
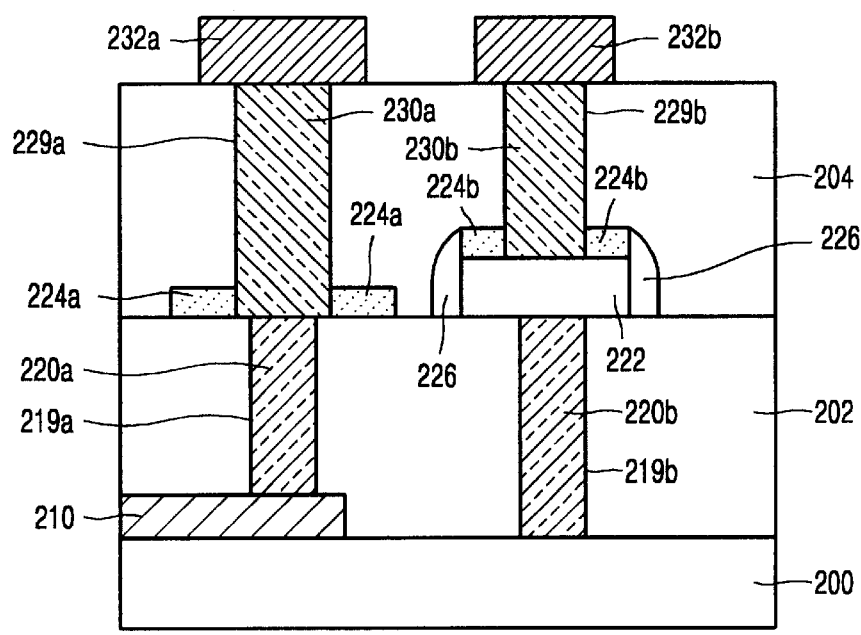
FIG. 2 is a cutaway side view of a multiple-layered interconnect configuration utilizing a selectively-patterned etch-stop layer, in accordance with the present invention.

FIG. 2 is a cutaway side view of a multiple-layered circuit configuration, in accordance with the present invention. A conductive layer pattern 210 is formed on a substrate 200. A first inter-layer dielectric 202 is provided over the conductive layer pattern. Contact holes 219A, 219B are formed in the inter-layer dielectric 202, and inter-layer contact studs 220A, 220B are provided in the contact holes 219A, 219B. A conductive line 222 is formed over one of the studs 220B, for example to later serve as a landing pad for an upper-level stud 230B.

A first etch-stop material layer 224 is selectively patterned on the upper surface of the lower-level stud 220A, and on a portion 224A of the inter-layer dielectric 202 surrounding the lower-level stud 220A. The first etch-stop material layer 224B is further patterned on the conductive line 222. A second etch-stop material layer is patterned over the resulting structure, and selectively removed so as to provide for lateral spacers 226 on the side walls of the conductive line 222. The first and second etch-stop material layers may comprise similar, or different, materials, for example $Si_3N_4$, $Ta_2O_5$ or $Al_2O_3$.

A second inter-layer dielectric 204 is formed over the resulting structure, and upper-level contact holes 229A, 229B are formed to provide for upper-level contact studs 230A, 230B. During formation of the holes 229A, 229B, the etch stop layers 224A, 224B serve as an alignment target to prevent over-etching of the underlying first interlayer dielectric 202 in the region surrounding the stud 220A, and to prevent over-etching of the landing pad 222. Following formation of the upper-level studs 230A, 230B, metal traces 232A, 232B are provided on the resulting structure to complete the circuit.

An exemplary application of the configuration of the present invention will now be described with reference to FIGS. 3A–3G and FIGS. 4A–4F which illustrate sequential sectional views of the formation of inter-level contacts in a memory device including cell and peripheral regions, in accordance with the present invention. The "X" and "Y" direction views represent sections taken along respective orthogonal axes of the device.

In FIG. 3A, an active memory cell 240 is formed in a substrate 200 of a memory device. The memory device includes a cell region 242 comprising densely-packed memory cells 240 and data lines, and a peripheral region 244, including interconnect lines, and peripheral circuitry, for example input/output circuitry, that service the memory cell region 242. Collectively, in the context of a memory device application, the data lines and peripheral interconnect lines are referred to herein as "bit lines". However, as explained above, the present invention is equally applicable to other embodiments requiring layer-to-layer interconnect.

An inter-layer dielectric layer 202, for example $SiO_2$, is formed on the active circuits 242 and substrate 200. Contact holes 219 are formed in the dielectric layer 202, for example by etching, and contact studs 220A, 220B are provided in the holes 219, as shown in FIG. 3B. The contacts 220A, 220B are may be formed of tungsten, at a thickness of 500–2000 Angstroms. The gas reaction for deposition may comprise, for example:

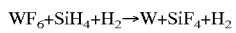

at 40 Torr, and 415 C. Typical n+/p+ contact resistance values are in the range of 300–1000 ohms per contact, assuming a 0.15 μm—wide bit line to an n+ contact, and 1.5–5 kilohms per contact for a 0.23 μm bit line to a p+ contact.

Assuming a tungsten plug, the plug 220A, 220B may be formed by first providing a titanium Ti layer, for example by chemical vapor deposition (CVD) to a thickness of 100 Angstroms. This is followed by providing a layer of TiN, for example by chemical vapor deposition or atomic layer deposition (ALD) to a thickness of 300 Angstroms; followed by a layer of tungsten (W) of approximately 2000 Angstroms in thickness. The resulting structure is polished by chemical-mechanical polishing or etch-back processes.

Assuming a titanium nitride TiN plug, the plug 220A, 220B may be formed by first providing a titanium Ti layer, for example by chemical vapor deposition (CVD) to a thickness of 100 Angstroms. This is followed by providing a layer of TiN, for example by chemical vapor deposition to a thickness of 1500 Angstroms; followed by a chemical-mechanical polishing process.

In FIG. 3C, a first etch stop layer 246, comprising for example $Si_3N_4$, $Ta_2O_5$ or $Al_2O_3$ is deposited over the resulting structure to a thickness of approximately 200–700 Angstroms, preferably less than 500 Angstroms. Photoresist is coated over the masking layer and patterned to form a mask 248 over the stud 220A to be connected to an upper level. The size of the mask pattern 248 is determined to be large enough to at least overlap the underlying contact stud 220A, yet small enough so as not to interfere with metal interconnections of neighboring contact holes. The first etch stop layer 246 is preferably chosen to have different etching selectivity with respect to the underlying inter-layer dielectric 202.

FIG. 3D illustrates the resulting localized first-etch-stop-layer pattern 250. It is preferred that the resulting structure 250 is taper-etched, to prevent residue formation or conductive stringers during the bit line formation steps to follow.

In FIG. 3E, a bit line pattern 252, and bit-line landing pads 254, having a second etch-stop capping layer 258, are formed in a conventional manner over the remaining studs. To avoid removal of the first etch-stop layer pattern 250, the second etch-stop layer 258 is preferably chosen to have a different etching selectivity, as compared to the first. For example, assuming the first etch-stop layer to comprise $Si_3N_4$, the second etch-stop layer may comprise $Ta_2O_5$ or $Al_2O_3$. In this manner, the second etch-stop layer 258 can be patterned and selectively removed, without affecting the previously fabricated first etch-stop layer pattern 250. Lateral dielectric spacers 256 are formed on the lateral side portions of the bit lines 252, 254.

To form the bit line and bit line landing pad 252, 254, tunsgten (W) is sputtered to a thickness of 800 Angstroms, and the second capping etch stop layer 258 is deposited to a thickness of 1500–2500 Angstroms. The resulting layers are patterned to form a bit line pattern and a bit line landing pad. After forming the bit line pattern, an insulating material layer, such as $Si_3N_4$, is deposited to a thickness of about 500 Angstroms and isotropically etched to form the lateral side spacers 256. For example, assume that a first etch-stop layer 246 comprises $Ta_2O_5$, a second etch-stop capping layer 258 comprises $Si_3N_4$ of 1500–2500 Angstroms, which is deliberately chosen to have different etching selectivity as compared to the first etch-stop layer 246, and an insulating material layer to form lateral side spacers 256 is, once again, $Si_3N_4$ of 500 Angstroms. While forming lateral side spacers by etching the insulating material ($Si_3N_4$, 500 Angstroms), the first etch-stop layer 246 can be maintained, and substantially unaffected, due to the aforementioned etching selectivity difference.

In this manner, a bit line landing pad 254 and bit line stud 220A are prepared for subsequent borderless contact formation. As a result, the circuit interconnection pattern can be accomplished in a relatively dense lateral configuration, for example in the dense configuration found in a peripheral region 244 of a semiconductor memory device.

In FIG. 3F, a second inter-layer dielectric layer 204 is formed over the resulting structure and storage node contact holes 262 are formed according to conventional techniques.

Figure 3G:
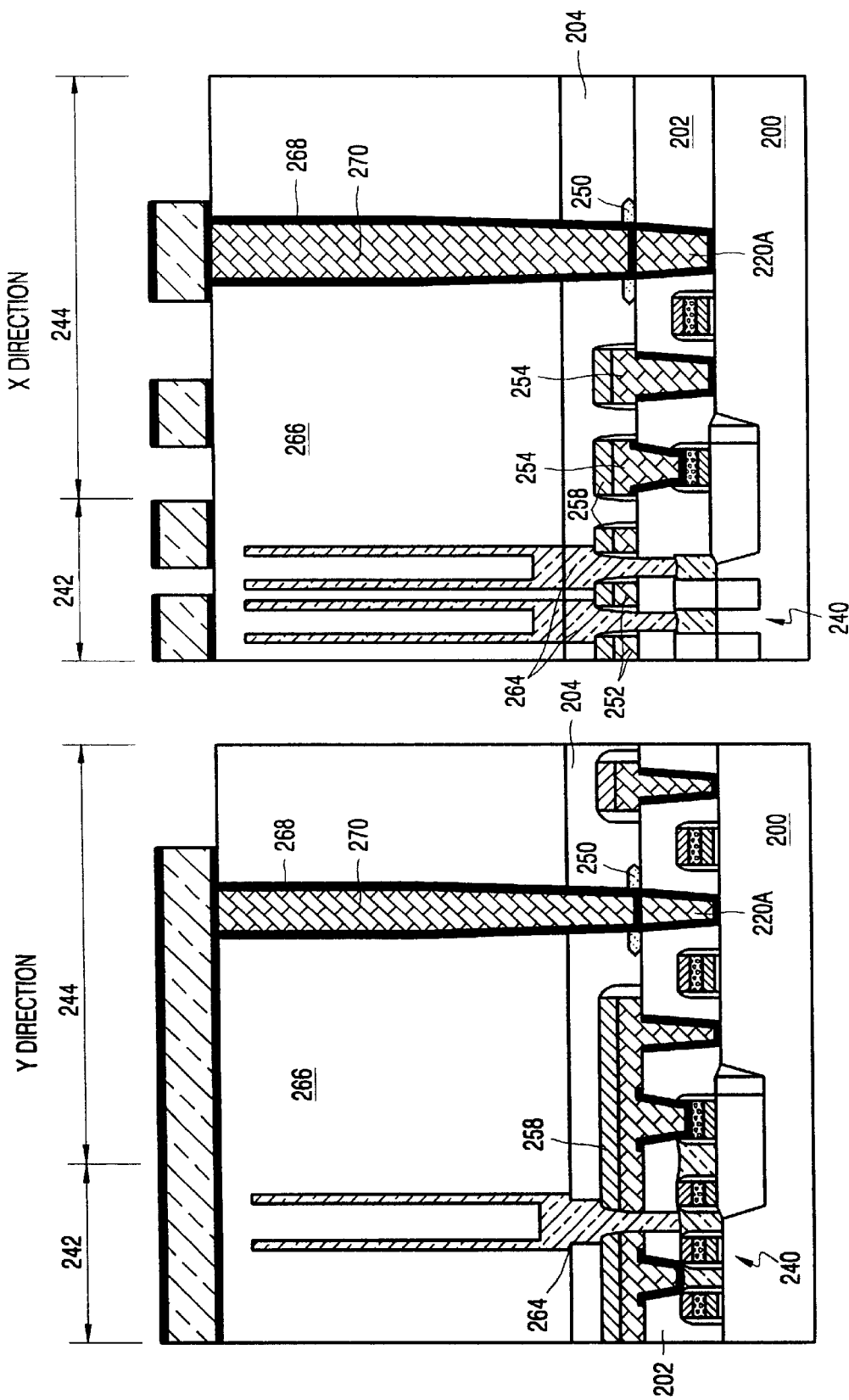

In FIG. 3G, the storage node contacts 264 are provided in the second inter-layer dielectric 204, and an third dielectric layer 266 is provided above the second 204. An upper-level contact hole 268 is provided in the dielectric layers 266, 204 using, for example, oxide etching, until the first etch-stop pattern 250, and second etch-stop pattern 258 are exposed. The underlying etch-stop layer patterns 250, 258 are used as vertical guides for ensuring that the holes properly expose the top of the underlying stud 220A, without over-etching the underlying first inter-layer dielectric 202 at the sides of the underlying stud 220A in the stud coupling region.

To ensure proper vertical alignment and coupling of the lower and upper studs 270, 220A respectively, the first etch-stop layer 250 material is chosen so as to have a different etch selectivity as compared to that of the underlying first inter-layer dielectric insulating layer 202. In this manner, when forming upper stud hole 268, a first etch process can be used to accurately etch the third and second insulating dielectric layers 266, 204 to the upper surface of the first etch-stop layer 250. Following this, the first etch-stop material layer 250 is accurately etched in a second etch process to the upper surface of the underlying stud 220A, and the top surface of the first insulating layer 202.

In a preferred embodiment, the second inter-layer dielectric 266 etching is performed until the top surface of the etch-stop layers are exposed by a first etch process comprising 1500 W, 40 mTorr, $C_4F_6+O_2+Ar$. Following this, etch-stop-layer attractive etching is performed using the underlying inter-layer dielectric 202 as an etch-stop to expose the top surface of the underlying stud 220A in a second etch process comprising 600 W, 50 mTorr, $CHF_3+Ar+H_2$, 105".

The first etch-stop layer 250 and the second etch-stop capping layer 258 are preferably etched during the same etching process, because the second step etching condition as disclosed in the specification is attractive for both the first etch-stop layer and the second etch-stop capping layer considerably with respect to the insulating layer 202. Even though the layers 250 and 258 are chosen to have etching selectivity with respect to each other, they preferably do not have big difference in etching selectivity with respect to the underlying insulating layer 202.

Separate processing is also possible, but impractical, because it requires either two different etching chemistries for 250 and 258 respectively, or one additional photolithography process in addition to one additional etching process.

Similar procedures are applicable simultaneously, or separately with the above process for providing inter-layer studs (not shown in the drawings) for coupling to other bit-lines of the peripheral region, for example bit lines including bit-line landing pads 254.

Figure 4A:
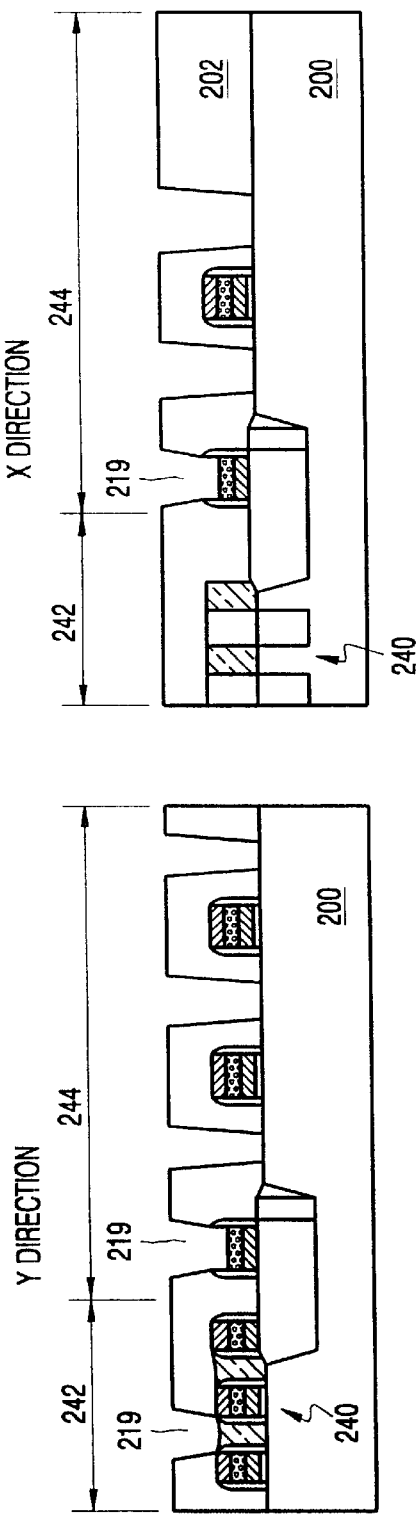
Figure 4B:
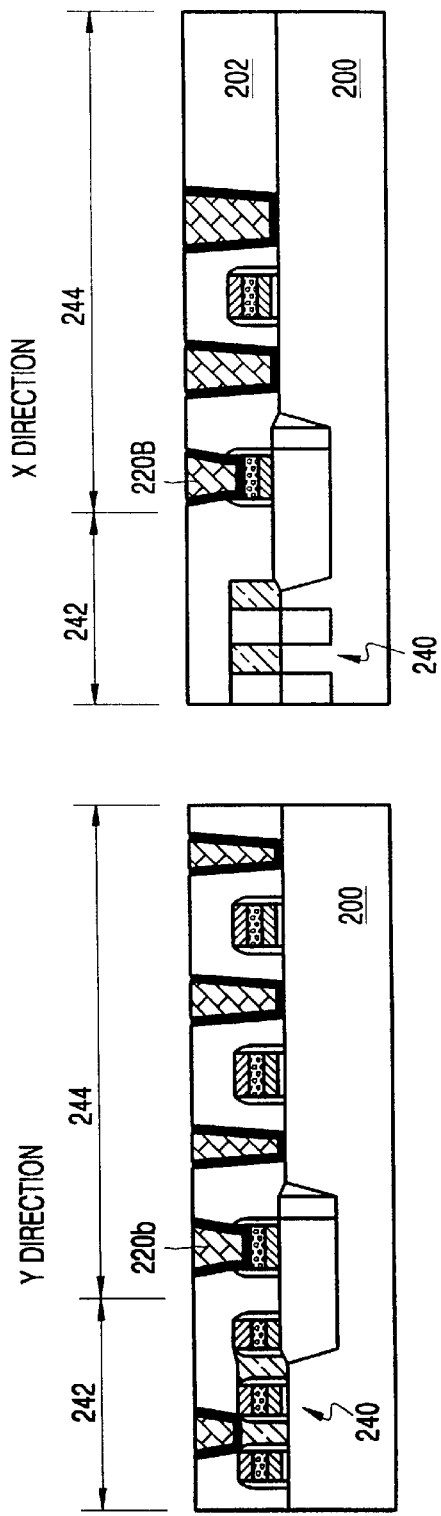
Figure 4C:
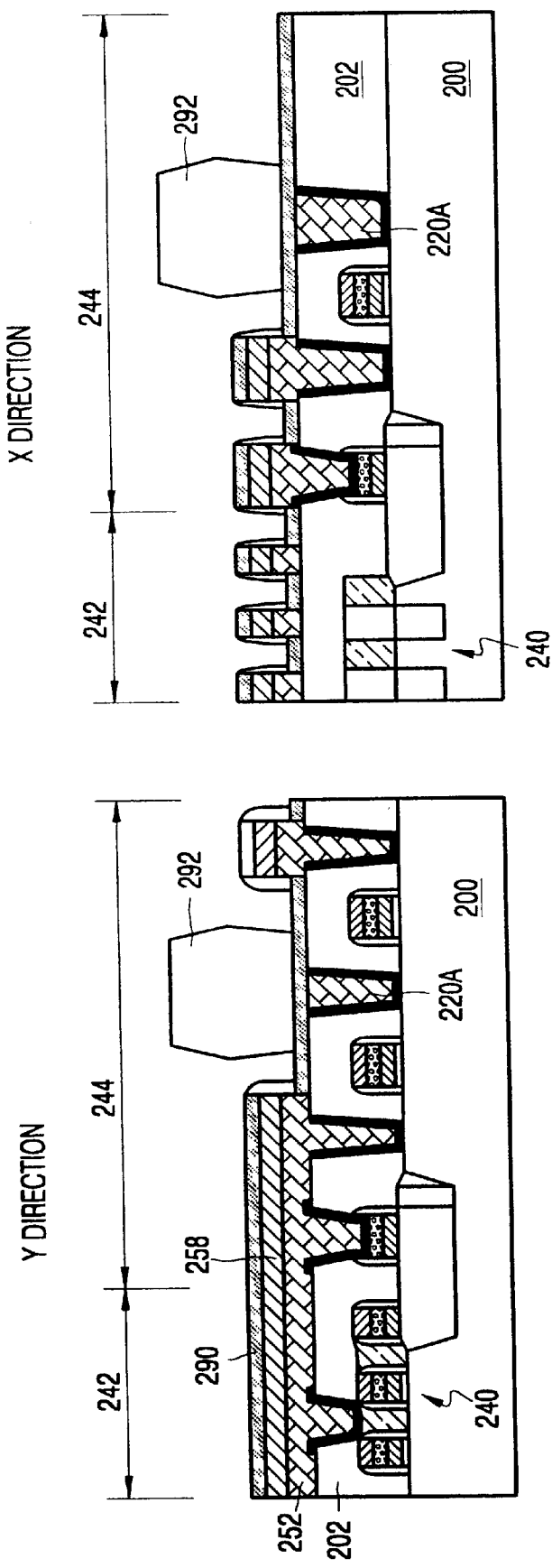
Figure 4F:
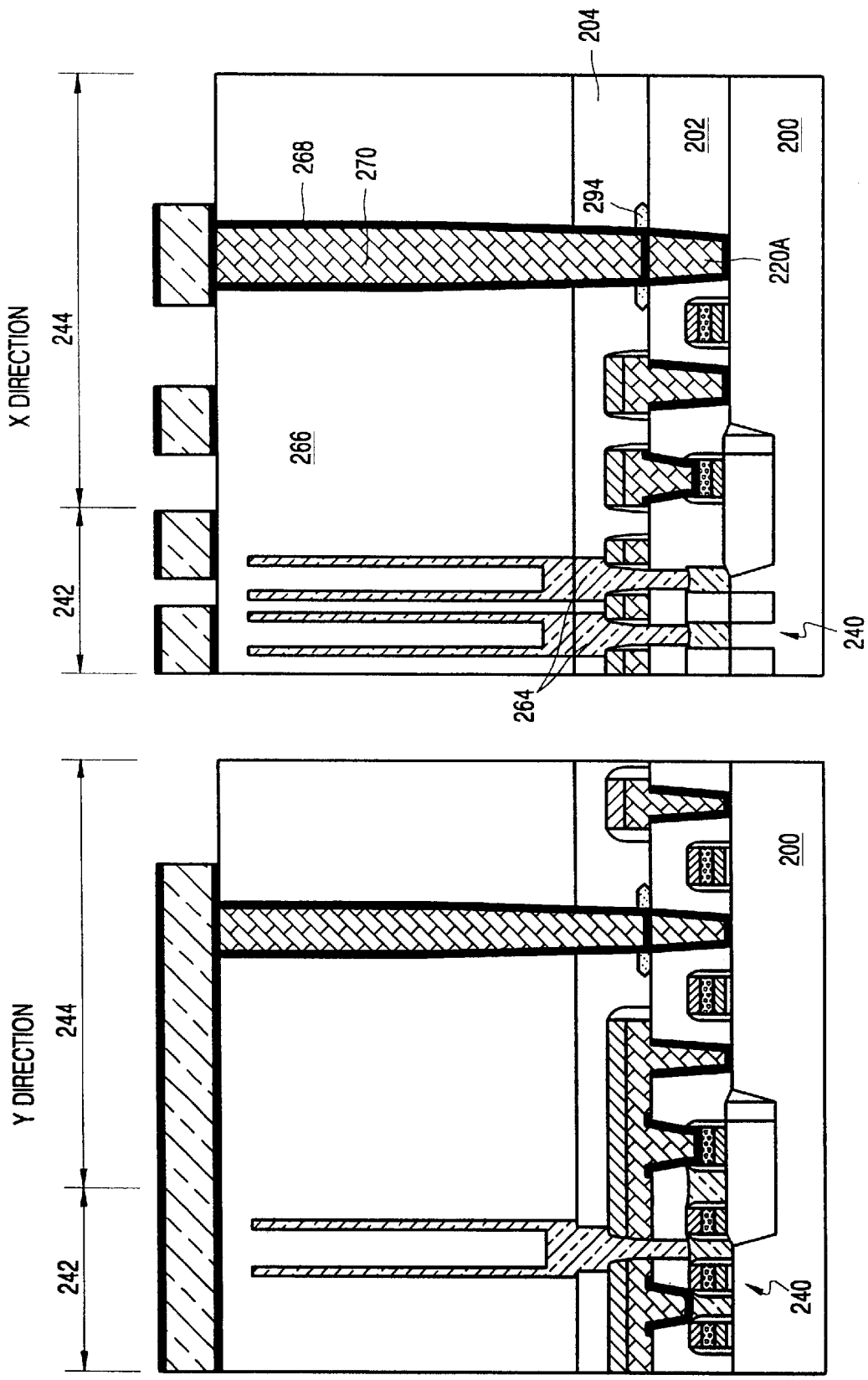

FIGS. 4–4F illustrate an alternative embodiment of the present invention. In FIGS. 4A and 4B, inter-level studs 220B are formed as described above with reference to FIGS. 3A and 3B. In FIG. 3C, a bit line pattern 252 is formed over the studs 220B, and a first etch stop layer 258, for example comprising $Si_3N_4$ is formed as a capping layer over the bit line pattern 252. A second etch stop layer 290, preferably comprising $Si_3N_4$, is formed to a thickness of 200–700 Angstroms, preferably less than 500 Angstroms over the resulting structure, including regions beyond the bit lines. In this embodiment, the first and second etch stop layers 258, 290 may comprise the same, or different, materials, for example $Si_3N_4$, $Ta_2O_5$ or $Al_2O_3$. A photoresist mask 292 is patterned over stud 220A region, as described above, and the second etch stop layer 290 is removed with the exception of the portion 294 lying under the mask 292, as shown in FIG. 4D. During this process, side spacers 296 are formed on the sides of the bit lines 252, as described above. In FIGS. 4E and 4F, the circuit is completed, as described above.

Due to the presence of the etch stop layer pattern 250, 294 in the region above the stud 220A in the embodiments of FIGS. 3 and 4, overetching, profile degradation, and resultant bad step coverage are avoided in the present invention. Accordingly, contact-induced bit failures are likewise mitigated.

Additionally, since the etch stop layer pattern 250, 294 is localized to the region of the top of the stud 220A, outgassing during subsequent processes, as well as alloying issues are considerably improved.

While this invention has been particularly shown and described with references to preferred embodiments thereof, it will be understood by those skilled in the art that various changes in form and details may be made herein without departing from the spirit and scope of the invention as defined by the appended claims.

For example, in an alternative embodiment, rather than a single metal deposition step, separate photolithographic processes may be employed to provide the metal contacts on the bit line patterns and the metal contact on the bit line stud.

We claim:

1. A semiconductor device comprising:

first and second circuit regions laterally disposed in a first insulating layer, wherein the first circuit region comprises a conductive line, and wherein the second circuit region comprises a stud; and first and second etch stop material layers formed over the first and second circuit regions, respectively, the first etch stop material layer forming at least one spacer at a sidewall of the conductive line, and the second etch stop material layer being selectively patterned in the second region to cover an area that includes the stud.

2. The semiconductor device of claim 1 wherein the first and second etch stop material layers comprise the same etch stop material.

3. The semiconductor device of claim 1 wherein the first and second etch stop material layers comprise materials having different etch selectivity characteristics.

4. The semiconductor device of claim 1 wherein the first and second etch stop material layers comprise a material selected from the group of materials consisting of $Si_3N_4$, $Ta_2O_5$ and $Al_2O_3$.

5. The semiconductor device of claim 1 wherein the second etch stop material layer extends to cover an area surrounding the stud.

6. The semiconductor device of claim 5 wherein the extent of the second etch stop material layer is limited by the width of the conductive line.

* * * * *